(12) United States Patent
Coleman

(10) Patent No.: US 9,994,153 B2
(45) Date of Patent: Jun. 12, 2018

(54) CAMERA FOR A MOTOR VEHICLE AND MOTOR VEHICLE

(71) Applicant: Connaught Electronics Ltd., Tuam, County Galway (IE)

(72) Inventor: Martin Oliver Coleman, Roscam (IE)

(73) Assignee: Connaught Electronics Ltd., Tuam, County Galway (IE)

( * ) Notice: Subject to any disclaimer, the term of this patent is extended or adjusted under 35 U.S.C. 154(b) by 0 days. days.

(21) Appl. No.: 15/520,371

(22) PCT Filed: Oct. 20, 2015

(86) PCT No.: PCT/EP2015/074237
§ 371 (c)(1),
(2) Date: Apr. 19, 2017

(87) PCT Pub. No.: WO2016/062707
PCT Pub. Date: Apr. 28, 2016

(65) Prior Publication Data
US 2017/0305346 A1    Oct. 26, 2017

(30) Foreign Application Priority Data
Oct. 21, 2014  (DE) .................. 10 2014 115 296

(51) Int. Cl.
*B60R 1/00* (2006.01)
*H01R 13/66* (2006.01)
(Continued)

(52) U.S. Cl.
CPC ............. *B60R 1/00* (2013.01); *H01R 13/658* (2013.01); *H01R 13/66* (2013.01);
(Continued)

(58) Field of Classification Search
CPC ........ B60R 1/00; H01R 13/658; H01R 13/66; H01R 13/6625; H04N 5/225;
(Continued)

(56) References Cited

U.S. PATENT DOCUMENTS

| 6,266,084 B1* | 7/2001 | Sakata | H01B 11/1891 174/32 |
| 2004/0098598 A1* | 5/2004 | Wolfram | G07C 9/00087 713/186 |

(Continued)

FOREIGN PATENT DOCUMENTS

| DE | 103 03 259 B3 | 9/2004 |
| DE | 10 2005 000655 A1 | 7/2006 |
| DE | 10 2008 000823 A1 | 10/2009 |

OTHER PUBLICATIONS

International Search Report issued in PCT/EP2015/074237 dated Feb. 2, 2016 (2 pages).

(Continued)

*Primary Examiner* — Orlando Bousono
(74) *Attorney, Agent, or Firm* — Osha Liang LLP

(57) ABSTRACT

The invention relates to a camera (2) for a motor vehicle (1), which includes a printed circuit board (16), on which a current connector (29) and a communication bus connector (30) and a video interface connector (31) each for connecting to the motor vehicle (1) are disposed, wherein the video interface connector (31) is connected to a capacitor (25) and a parallel-to-serial converter (26), wherein the video interface connector (31) and/or the capacitor (25) and/or the parallel-to-serial converter (26) are surrounded by a device (32) shielding electromagnetic radiation.

12 Claims, 4 Drawing Sheets

Figure 1:
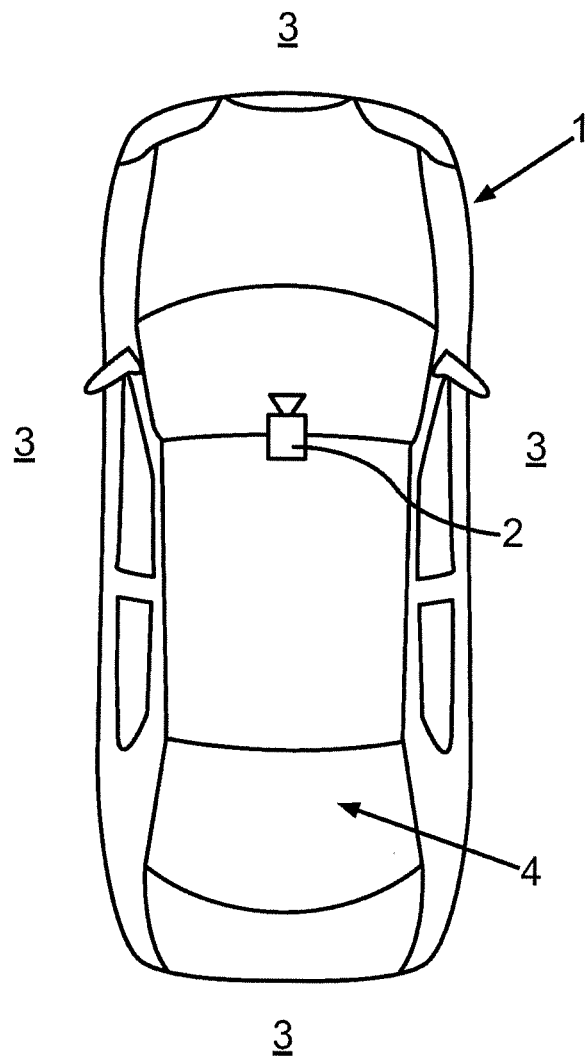

(51) Int. Cl.
*H04N 5/225* (2006.01)
*H01R 13/658* (2011.01)
*H05K 1/02* (2006.01)
*H05K 1/14* (2006.01)

(52) U.S. Cl.
CPC ......... *H01R 13/6625* (2013.01); *H04N 5/225* (2013.01); *H04N 5/2257* (2013.01); *H05K 1/0218* (2013.01); *H05K 1/14* (2013.01); *H01R 2201/26* (2013.01); *H05K 2201/0715* (2013.01); *H05K 2201/10121* (2013.01)

(58) Field of Classification Search
CPC .............. H04N 5/2257; A61B 1/00016; A61B 1/00029; A61B 1/00105; A61B 1/00124; A61B 1/042; B60Q 1/1423; B60Q 2300/056; B60Q 2300/21; B60Q 2300/314; B60Q 2300/41
See application file for complete search history.

(56) References Cited

U.S. PATENT DOCUMENTS

| | | | |
|---|---|---|---|
| 2004/0262528 A1* | 12/2004 | Zaikin | G01T 1/1644 250/369 |
| 2010/0203764 A1 | 8/2010 | Chang | |
| 2013/0044436 A1* | 2/2013 | Kovatchev | H05K 1/0218 361/720 |
| 2013/0222595 A1* | 8/2013 | Gebauer | H04N 5/217 348/148 |
| 2014/0184771 A1* | 7/2014 | Mazzetti | H02J 5/00 348/75 |

OTHER PUBLICATIONS

Written Opinion of the International Searching Authority issued in PCT/EP2015/074237 dated Feb. 2, 2016 (6 pages).

\* cited by examiner

CAMERA FOR A MOTOR VEHICLE AND MOTOR VEHICLE

The invention relates to a camera for a motor vehicle, which includes a printed circuit board, on which a current connector and a communication bus connector and a video interface connector are respectively disposed for connecting to the motor vehicle. The video interface connector is connected to a capacitor and a parallel-to-serial converter. In addition, the invention relates to a motor vehicle with at least one camera.

Cameras for motor vehicles are known from the prior art. Thus, these cameras mostly have a current connector and a communication bus connector and a video interface connector. The current connector mostly serves for connecting the camera to the current supply of the motor vehicle. The communication bus connector can for example be a CAN (controller area network) bus. An LVDS (low voltage differential signaling) bus is often used as the video interface connector. Furthermore, the camera mostly includes a CCD (charge-coupled device) sensor or a CMOS (complementary metal-oxide-semiconductor) sensor. A poor electromagnetic compatibility (EMV) is disadvantageous in the prior art. The electromagnetic compatibility characterizes the usually desired state that technical apparatuses do not affect each other by unwanted electric or electromagnetic effects in interfering manner. The electromagnetic compatibility includes all of the unwanted or wanted malfunctions of electric or electronic equipments by for example electric, magnetic or electromagnetic fields and operations. Therein, influences by currents or voltages are already included. In the electromagnetic compatibility, it is differentiated between line-related and field-related interferences. The line-related interferences are directly transmitted from the interfering source via supply or signal lines to the interference sink. All of the capacitive and inductive influences of electric and magnetic fields, respectively, are referred to as field-related interferences or briefly interfering fields. Presently, the interest is preferably directed to the field-related interferences.

It is the object of the invention to provide a camera, by which a particularly high electromagnetic compatibility is achieved. It is also the object to form a motor vehicle with such a camera.

According to the invention, this object is solved by a camera as well as by a motor vehicle having the features according to the respective independent claims.

A camera according to the invention for a motor vehicle includes a printed circuit board, on which a current connector and a communication bus connector and a video interface connector are disposed. The current connector and the communication bus connector and the video interface connector are provided for connecting to the motor vehicle. The video interface connector is connected to a capacitor and to a parallel-to-serial converter (Serializer). According to the invention, it is provided that the video interface connector and/or the capacitor and/or the parallel-to-serial converter are surrounded by a device shielding electromagnetic radiation.

Thus, very specific components of the camera are disposed individually EMV shielded and therefore correspondingly encased individually and related to components compared to further components. Thus, with the invention, a complete environment of the camera is not formed with the device acting in EVM shielding manner, but only some specific components of all of the components of the camera are surrounded by the device, however, not the other remaining components.

With the camera according to the invention for the motor vehicle, it becomes possible to provide a particularly high electromagnetic compatibility. Thus, the video interface connector is for example a component of the camera, which emits particularly high electromagnetic radiation and thereby is able to interfere with other components of the camera and/or other components of the motor vehicle. Electromagnetic radiation also emanates from the parallel-to-serial converter and/or the capacitor. By shielding or encasing the video interface connector and/or the capacitor and/or the parallel-to-serial converter by the device, the electromagnetic radiation can be prevented from propagation. The video interface connector and/or the capacitor are in particular encased or completely surrounded by the device. The propagation of the electromagnetic radiation can therefore be restricted in all directions by the device.

Preferably, it is provided that the device is formed at least in two-part manner. This means that the video interface connector and/or the capacitor and/or the parallel-to-serial converter do not have to be surrounded by a single or an integral device. Rather, it can be the case that partial devices of the device are used to shield the video interface connector and/or the capacitor and/or the parallel-to-serial converter. A simpler manufacture and/or a simpler assembly of the device are advantageous.

Furthermore, it is provided that the device is connected to a ground potential of the motor vehicle in electrically conducting manner. The ground potential or a ground denotes a conducting body, which is usually defined with the potential of 0 Volts and represents the reference potential for all of the signal and operating voltages. Mostly, the electric minus pole of the feeding voltage is at the same time the ground. The ground potential is often, but not necessarily, near or equal to the earth potential. The ground is often galvanically connected to an earth of the motor vehicle. The connection of the device to the ground potential of the motor vehicle is advantageous because the shielding of the electromagnetic radiation can thereby particularly effectively take place.

In particular, it is provided that the device is connected to a ground potential of the printed circuit board in electrically conducting manner. Thus, the connection of the device to the ground potential of the printed circuit board can in turn result in the shielding of the electromagnetic radiation taking place in particularly effective manner. Furthermore, a low constructional effort is advantageous because the nearby ground potential of the printed circuit board can be used. Thus, it is not necessarily required to resort to a ground potential farther away from the printed circuit board to use the device particularly effectively for shielding the electromagnetic radiation.

In a further embodiment, it is provided that a first partial element of the device is integrated in the printed circuit board. Thus, it can be provided that the device extends at least partially within the printed circuit board and thus can be particularly effectively used for shielding the electromagnetic radiation. Furthermore, a protective ground line or a connection of the device to the ground potential can be integrated in the printed circuit board. Thus, a particularly reliable connection of the device to the ground potential can be provided. The integration of the device and/or the protective ground line of the device can for example be effected during the manufacturing process of the printed circuit board.

Furthermore, it is provided that a second partial element of the device is formed as a surface-mounted device (SMD) of the printed circuit board. In contrast to components of the through-hole technology (THT), surface-mounted devices do not have wire connectors, but are directly soldered to the printed circuit board by solderable pads. The associated assembly technique is the surface mounting technology (SMT). By the surface-mounted device, a particularly dense assembly of the printed circuit board and/or a two-sided assembly of the printed circuit board can be effected, whereby the space requirement of the components or of the device is reduced. The device or the second partial element of the device can thereby be smaller and/or more inexpensively manufactured.

Preferably, it is provided that a first partial device of the device surrounds the video interface connector. Thus, the first partial device can shield the video interface connector. It is preferably provided that exclusively the video interface connector is encased or shielded by the first partial device. A particularly simple assembly and/or manufacture, for example as a surface-mounted device, of the device are advantageous with the first partial device.

Furthermore, it is preferably provided that a second partial device of the device surrounds the capacitor and/or the parallel-to-serial converter, in particular only the capacitor and/or the parallel-to-serial converter. The shielding of the capacitor and/or the parallel-to-serial converter can be particularly simply realized by the second partial device. The shielding of the capacitor and/or the parallel-to-serial converter is particularly effective by the second partial device.

In particular, it is provided that the first partial device and the second partial device are connected to each other in electrically conducting manner. The connection of the first partial device and the second partial device has the advantage that exclusively the first partial device or the second partial device has to be connected to the ground potential. The electrically conducting connection between the first partial device and the second partial device can for example be integrated in the printed circuit board. Thus, the electrically conducting connection can extend within the printed circuit board. This in turn can have an advantageous effect if the first partial device is disposed on a different side of the printed circuit board from the second partial device. The electrically conducting connection can be the first partial element of the device.

Furthermore, it can be provided that the first partial device and the second partial device are each separately connected to a ground potential of the printed circuit board in electrically conducting manner. The separate connection to the ground potential can be advantageous because thereby the integration of the first partial element of the device in the printed circuit board can possibly remain unconsidered. Thus, if for example the first partial device is disposed on a different side of the printed circuit board from the second partial device, an electrically conducting connection of the first partial device and the second partial device can be effected in that it is integrated in the printed circuit board, thus extends within the printed circuit board from one side of the printed circuit board to the other side of the printed circuit board, or the first partial device and the second partial device are for example connected to separate ground potentials additionally or alternatively to the connection extending within the printed circuit board.

The second partial element can for example correspond to the first partial device since both the second partial element and the first partial device can be adapted to shield the video interface connector. However, the second partial element can also be adapted additionally or alternatively to shield other components such as for example the capacitor and/or the parallel-to-serial converter. The first partial element is preferably integrated in the printed circuit board and can for example be a part of the first partial device and/or the second partial device.

In a further implementation, it is provided that the current connector and/or the communication bus connector are formed without the device and/or without a further device shielding electromagnetic radiation. This means that the current connector and/or the communication bus connector are not individually encased themselves as components. The shielding of the current connector and/or the communication bus connector is not required since the device already shields the video interface connector and/or the capacitor and/or the parallel-to-serial converter and thus emitting sources. An advantage achieved by the non-shielding of the current connector and/or the communication bus connector is a camera reducing components. Thus, it can be possible that the current connector or a harness connected to the current connector and/or the communication bus connector or a harness of the communication bus connector are provided without the device and/or without the further device.

Preferably, it is provided that the device is at least partially formed from zinc and/or aluminum and/or brass. Zinc, aluminum and brass are conducting materials, which are suitable for particularly effectively shielding the electromagnetic radiation. Thus, the electromagnetic compatibility can be particularly highly provided by aluminum and/or zinc and/or brass.

Furthermore, it is provided that the communication bus connector is formed as a CAN bus and/or the video interface connector is formed as an LVDS bus and/or the capacitor is formed as an alternating current capacitor. The CAN bus is a serial bus system and belongs to the field busses. The CAN bus is a particularly widespread bus system within the motor vehicle technique. The LVDS bus or the LVDS bus connector is an interface standard for high-speed data transfer. The LVDS bus is often used for transmitting video signals. The alternating current capacitor can be used to protect the parallel-to-serial converter from short-circuits. The alternating current capacitor can be formed as an inline capacitor, which is used depending on two channels of a video output signal.

The invention also includes a motor vehicle with a camera according to the invention or an advantageous implementation thereof. The motor vehicle is in particular formed as a passenger car.

The preferred embodiments presented with respect to the camera according to the invention and the advantages thereof correspondingly apply to the motor vehicle according to the invention.

Further features of the invention are apparent from the claims, the figures and the description of figures. The features and feature combinations mentioned above in the description as well as the features and feature combinations mentioned below in the description of figures and/or shown in the figures alone are usable not only in the respectively specified combination, but also in other combinations or alone, without departing from the scope of the invention. Thus, implementations are also to be considered as encompassed and disclosed by the invention, which are not explicitly shown in the figures and explained, but arise from and can be generated by separated feature combinations from the explained implementations.

Below, embodiments of the invention are explained in more detail based on schematic drawings.

Figure 2:
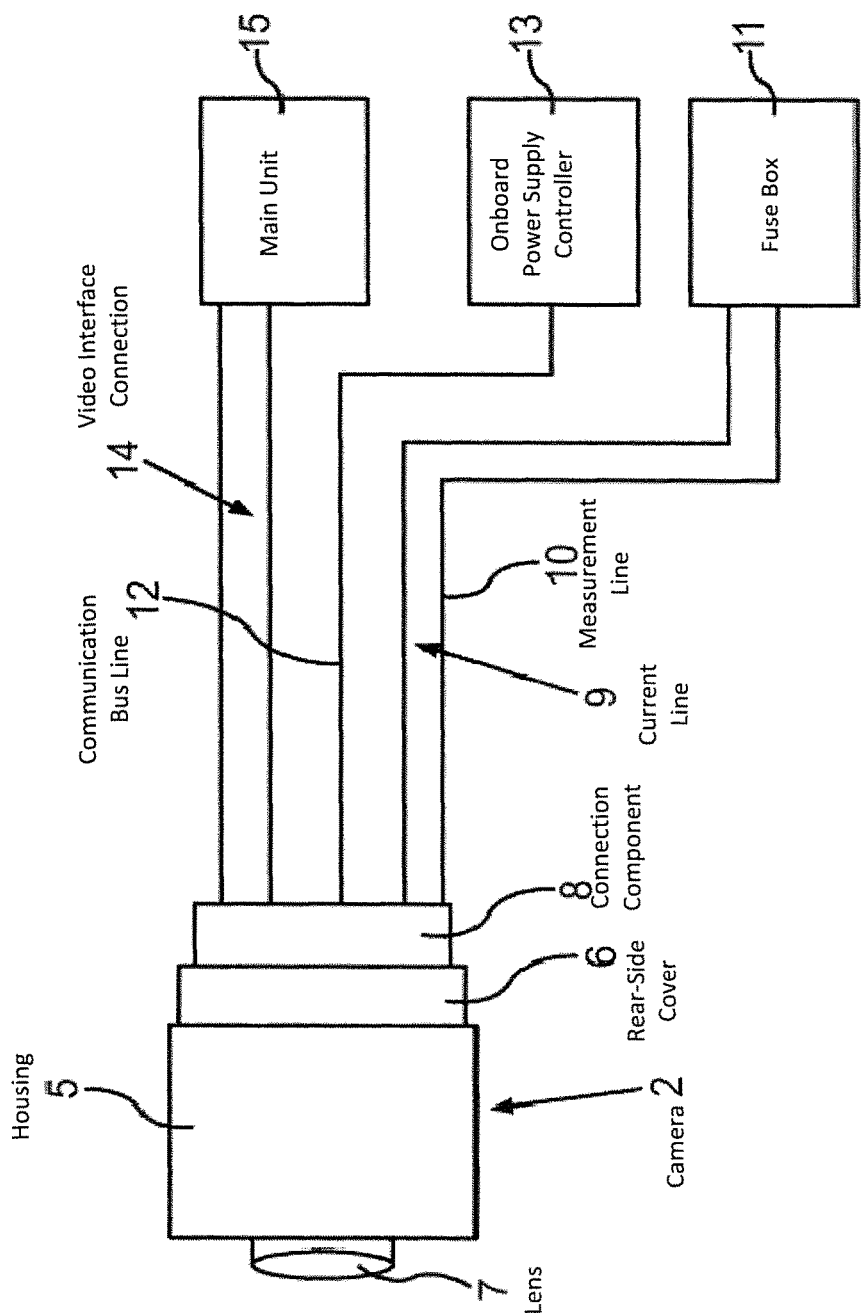
Figure 3:
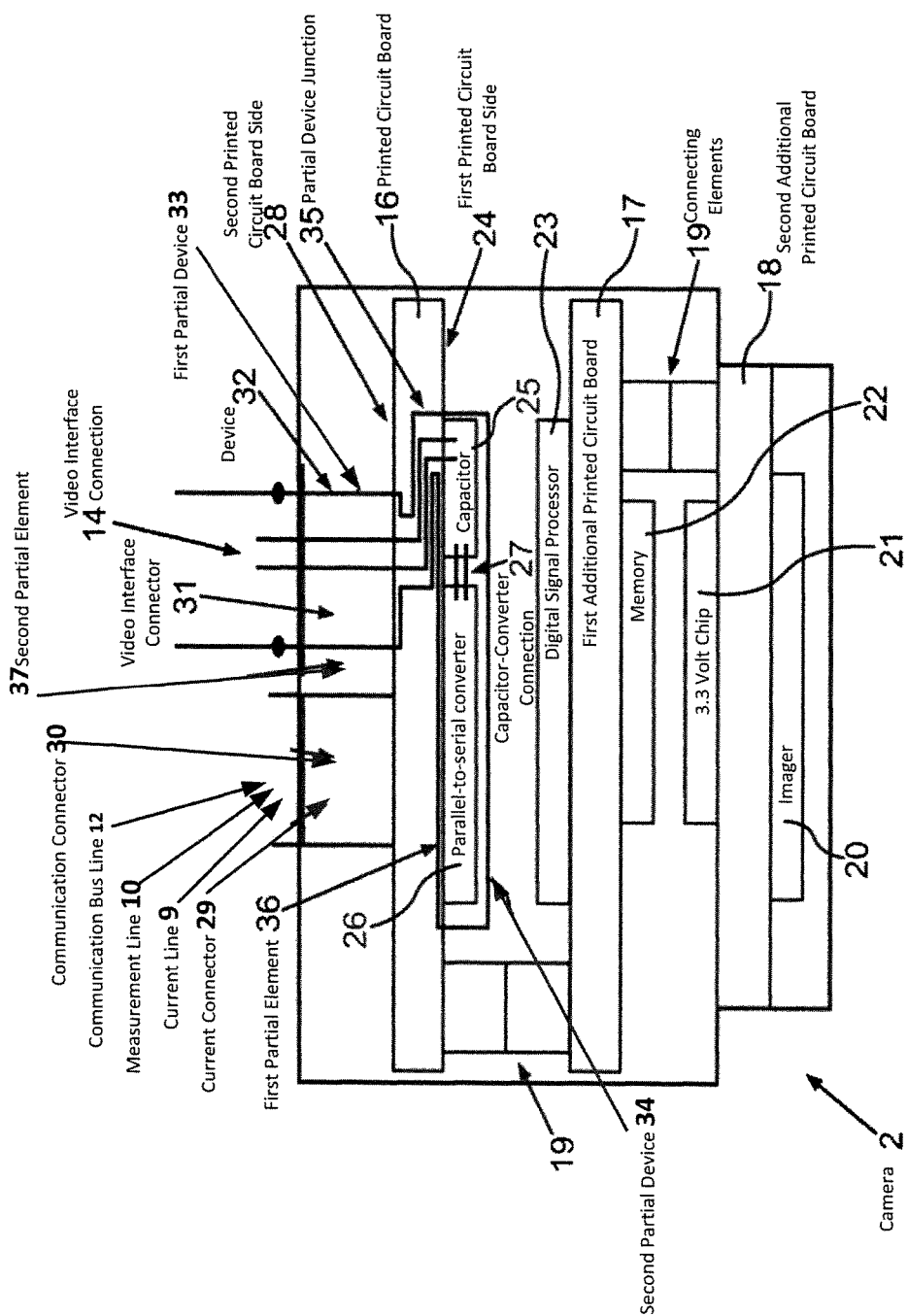
Figure 4:
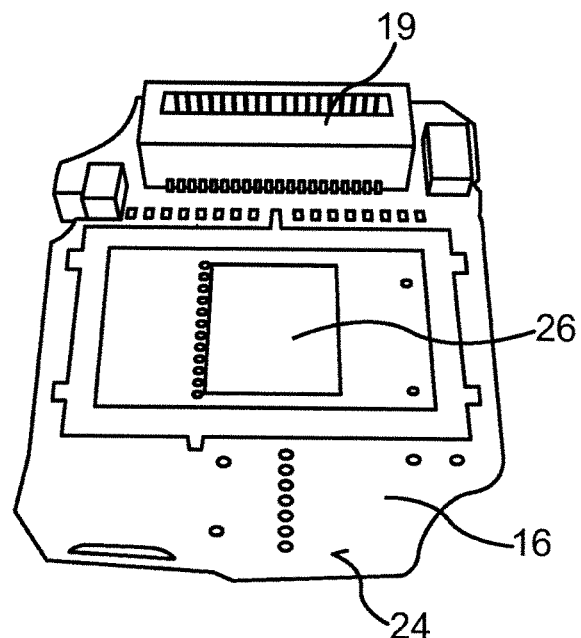
Figure 5:
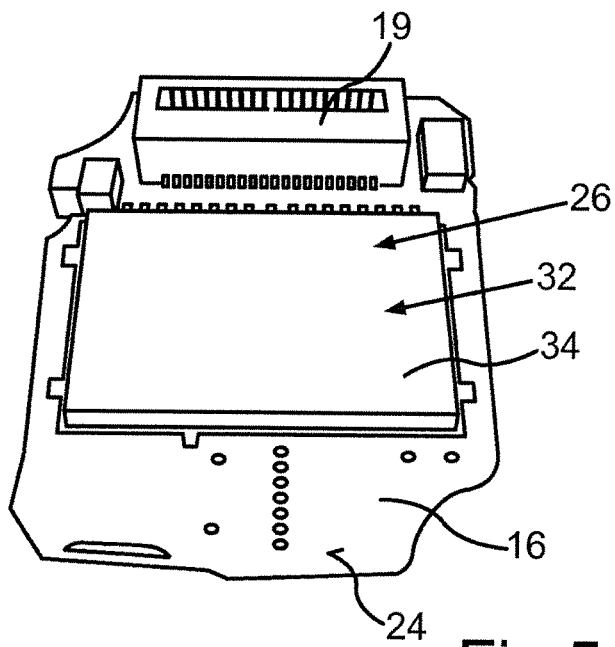

There show:

FIG. 1 in schematic plan view an embodiment of a motor vehicle according to the invention with a camera;

FIG. 2 a schematic illustration of the camera, which is connected to the motor vehicle by a current connector and a communication bus connector and a video interface connector;

FIG. 3 a schematic sectional illustration of the camera, which includes the current connector and the communication bus connector and the video interface connector and a capacitor and a parallel-to-serial converter;

FIG. 4 a schematic illustration of a printed circuit board of the camera according to the prior art; and FIG. 5 a schematic illustration of the printed circuit board with a parallel-to-serial converter shielded by a device shielding electromagnetic radiation according to an implementation of the invention.

In FIG. 1, a plan view of a motor vehicle 1 with a camera 2 according to an embodiment of the invention is schematically illustrated. The arrangement of the camera 2 on the motor vehicle 1 is arbitrary, however preferably such that an environmental region 3 of the motor vehicle 1 and/or an interior area 4 of the motor vehicle 1 can be captured.

The motor vehicle 1 can also include multiple such cameras 2.

The camera 2 can be a CMOS camera or else a CCD camera or any image capturing device.

FIG. 2 schematically shows the camera 2. In the embodiment, the camera 2 includes a housing 5, a rear-side cover 6, a lens 7 and a connection component 8. The camera 2 is connected to the motor vehicle 1 by the connection component 8. A current line 9 is led to a fuse box 11 of the motor vehicle 1 by the connection component 8. Moreover, a measurement line 10 is led from the connector component 8 to the fuse box 11. Furthermore, a communication bus line 12 connects the camera 2 to an onboard power supply controller 13 (BCM—body control module) of the motor vehicle 1. Furthermore, the camera 2 is connected to a main unit 15 of the motor vehicle 1 via a video interface connection 14.

The video interface connection 14 is formed as an LVDS (low voltage differential signaling) connection according to the embodiment. The video signal of the camera 2 is transmitted via the LVDS connection. The communication bus line 12 is configured as a CAN (controller area network) bus connection according to the embodiment.

FIG. 3 shows the interior of the camera 2 with its components. The camera 2 includes a printed circuit board 16 and a first additional printed circuit board 17 and a second additional printed circuit board 18. The printed circuit board 16 and the first additional printed circuit board 17 and the second additional printed circuit board 18 are each disposed against each other with connecting elements 19.

An imager 20 and a chip, in particular a 3.3 Volt chip 21, are located on the second additional printed circuit board 18. A memory 22 and a digital signal processor 23 are disposed on the first additional printed circuit board 17.

A capacitor 25 and a parallel-to-serial converter 26 are disposed on the printed circuit board 16 on a first printed circuit board side 24. The capacitor 25 is an alternating current capacitor according to the embodiment. The capacitor 25 is electrically connected to the parallel-to-serial converter 26 by a capacitor-converter connection 27. The capacitor 25 serves for protecting the parallel-to-serial converter 26 from short-circuits. The parallel-to-serial converter 26 can for example be a chip receiving a 24 bit data stream and converting it or transforming it in a two-channel video output signal.

On a second printed circuit board side 28 of the printed circuit board 16, a current connector 29, a communication bus connector 30 and a video interface connector 31 are disposed. According to the embodiment of FIG. 3, the second printed circuit board side 28 on the printed circuit board 16 is disposed opposite to the first printed circuit board side 24. The current connector 29 is connected to the current line 9 and thus also to the ground line 10. The communication connector 30 is connected to the communication bus line 12. The video interface connector 31 is connected to the video interface connection 14.

The video interface connector 31 as well as the capacitor 25 and the parallel-to-serial converter 26 are surrounded by a device 32 shielding electromagnetic radiation. Only the video interface connector 31 and the capacitor 25 and the parallel-to-serial converter 26 are shielded or encased by the device 32 such that electric and/or electromagnetic radiation cannot penetrate to the outside to the other mentioned components in the camera 2. The other components of the camera 2, for example the communication bus connector 30 and/or the current connector 29 and/or the imager 20, are protected or shielded from the electromagnetic radiation of the video interface connector 31 and/or the capacitor 25 and/or the parallel-to-serial converter 26.

According to the embodiment of FIG. 3, the device 32 has a first partial device 33 surrounding the video interface connector 31. The first partial device 33 is formed as a surface-mounted device of the printed circuit board 16 according to the embodiment. A second partial device 34 of the device 32 surrounds the capacitor 25 and the parallel-to-serial converter 26. The first partial device 33 and the second partial device 34 are connected to each other in electrically conducting manner. At a partial device junction 35 of the printed circuit board 16, the device 32 is partially integrated in the printed circuit board 16 or integrated in it with a first partial element 36 of the device 32. This means that the device 32 extends on the partial device junction 35 and in the environment within the printed circuit board 16. A second partial element 37 is formed as a surface-mounted device of the printed circuit board 16.

Furthermore—not further illustrated in FIG. 3—the device 32 is connected to a ground potential of the printed circuit board 16.

According to the embodiment, the device 32 is formed or manufactured from zinc and/or aluminum and/or brass.

By the device 32, the electromagnetic radiation from the video interface connector 31 and the capacitor 25 and the parallel-to-serial converter 26 is reduced such that the communication bus connector 30 and the current connector 29 can be used without the device 32 and/or a further device shielding electromagnetic radiation.

The arrangement of the current connector 29 and/or the communication bus connector 30 and/or the video interface connector 31 and/or the capacitor 25 and/or the parallel-to-serial converter 26 is to be understood as an embodiment and can be arbitrarily disposed within or on the camera 2 if this is feasible during the manufacturing process.

FIG. 4 shows the printed circuit board 16 with one of the connecting elements 19 and with the parallel-to-serial converter 26. According to FIG. 4, the printed circuit board 16 and the parallel-to-serial converter 26 are shown as they are present in the prior art, namely without the device 32. The electromagnetic radiation of the parallel-to-serial converter 26 can therefore radiate in unimpeded manner and propagate in unimpeded manner. Thus, other components of the camera 2 and/or other components of the motor vehicle 1 are impaired in their function by radiated and non-shielded electromagnetic radiation.

FIG. 5 shows the printed circuit board 16 with the connecting element 19 and the parallel-to-serial converter 26 shielded by the device 32 as an implementation of the invention. According to the embodiment of FIG. 5, the second partial device 34 of the device 32 is shown to shield or encase the parallel-to-serial converter 26. According to the embodiment according to the invention of FIG. 5, the electromagnetic radiation generated by the parallel-to-serial converter 26 is prevented from propagating in the camera 2 and/or in the motor vehicle 1 by the device 32. Other components of the camera 2, for example the communication bus connector 30 and/or the current connector 29, now are thus shielded or protected from the electromagnetic radiation of the parallel-to-serial converter 26. Thus, the device 32 shields the electromagnetic radiation, where it substantially arises.

According to the embodiment of FIGS. 1 to 3 and FIG. 5, thus, a camera can be provided with the camera 2, which has a particularly good and high electromagnetic compatibility, respectively.

The invention claimed is:

1. A camera for a motor vehicle, comprising:
   a printed circuit board, on which a current connector, a communication bus connector and a video interface connector each for connecting to the motor vehicle are disposed,
   wherein the video interface connector is connected to a capacitor and a parallel-to-serial converter,
   wherein the video interface connector, the capacitor, and the parallel-to-serial converter are surrounded by a shielding device for shielding electromagnetic radiation, and
   wherein the shielding device comprises a first partial device and a second partial device that are connected to each other in an electrically conducting manner.

2. The camera according to claim 1, wherein the shielding device is connected to a ground potential of the motor vehicle in an electrically conducting manner.

3. The camera according to claim 1, wherein the shielding device is connected to a ground potential of the printed circuit board in an electrically conducting manner.

4. The camera according to claim 3, wherein a first partial element of the shielding device is integrated in the printed circuit board.

5. The camera according to claim 3, wherein a second partial element of the shielding device is formed as a surface-mounted device of the printed circuit board.

6. The camera according to claim 1, wherein the first partial device of the shielding device surrounds the video interface connector.

7. The camera according to claim 1, wherein the second partial device of the device surrounds the capacitor and/or the parallel-to-serial converter.

8. The camera according to claim 1, wherein the first partial device and the second partial device are each separately connected to a ground potential of the printed circuit board in the electrically conducting manner.

9. The camera according to claim 1, wherein the current connector and/or the communication bus connector are formed without the shielding device and/or without a further device shielding electromagnetic radiation.

10. The camera according to claim 1, wherein the shielding device is at least partially formed from zinc and/or aluminum and/or brass.

11. The camera according to claim 1, wherein the communication bus connector is formed as a CAN bus and/or the video interface connector is formed as an LVDS bus and/or the capacitor is formed as an alternating current capacitor.

12. A motor vehicle comprising at least one camera according to claim 1.

* * * * *